(12) United States Patent
Mancoff et al.

(10) Patent No.: US 7,605,437 B2
(45) Date of Patent: Oct. 20, 2009

(54) SPIN-TRANSFER MRAM STRUCTURE AND METHODS

(75) Inventors: Frederick B. Mancoff, Chandler, AZ (US); Nicholas D. Rizzo, Gilbert, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 84 days.

(21) Appl. No.: 11/736,960

(22) Filed: Apr. 18, 2007

(65) Prior Publication Data

US 2008/0258247 A1   Oct. 23, 2008

(51) Int. Cl.
*H01L 29/82* (2006.01)
(52) U.S. Cl. .............. 257/421; 257/295; 257/E27.006; 438/57; 365/158; 365/171; 365/173
(58) Field of Classification Search .............. 257/421, 257/E27.006
See application file for complete search history.

(56) References Cited

U.S. PATENT DOCUMENTS 6,714,444 B2   3/2004   Huai et al.

| | | | |
|---|---|---|---|
| 2005/0057960 A1 | 3/2005 | Saito et al. | |
| 2005/0164414 A1* | 7/2005 | Deak | 438/3 |
| 2006/0114618 A1 | 6/2006 | Hosomi et al. | |
| 2006/0262594 A1* | 11/2006 | Fukumoto | 365/158 |
| 2007/0201168 A1* | 8/2007 | Sugibayashi et al. | 360/324 |

OTHER PUBLICATIONS

Berger, L., Multilayer configuration for experiments of spin precession induced by a dc current, J Appl. Phys. 93, No. 10,(7693) May 15, 2003.
Fuch, G. D., et al Adjustable spin torque in magnetic tunnel junction with two fixed layers, Applied Physics Letters, 86,152509, 2005.

* cited by examiner

*Primary Examiner*—Tu-Tu V Ho
(74) *Attorney, Agent, or Firm*—Ingrassia, Fisher & Lorenz, P.C.

(57) ABSTRACT

A spin-transfer MRAM bit includes a free magnet layer positioned between a pair of spin polarizers, wherein at least one of the spin polarizers comprises an unpinned synthetic antiferromagnet (SAF). The SAF may include two antiparallel fixed magnet layers separated by a coupling layer. To improve manufacturability, the layers of the SAF may be non-symmetrical (e.g., having different thicknesses or different inherent anisotropies) to assist in achieving proper alignment during anneal. The total magnetic moment of the SAF may be greater than that of the free magnet layer.

16 Claims, 3 Drawing Sheets

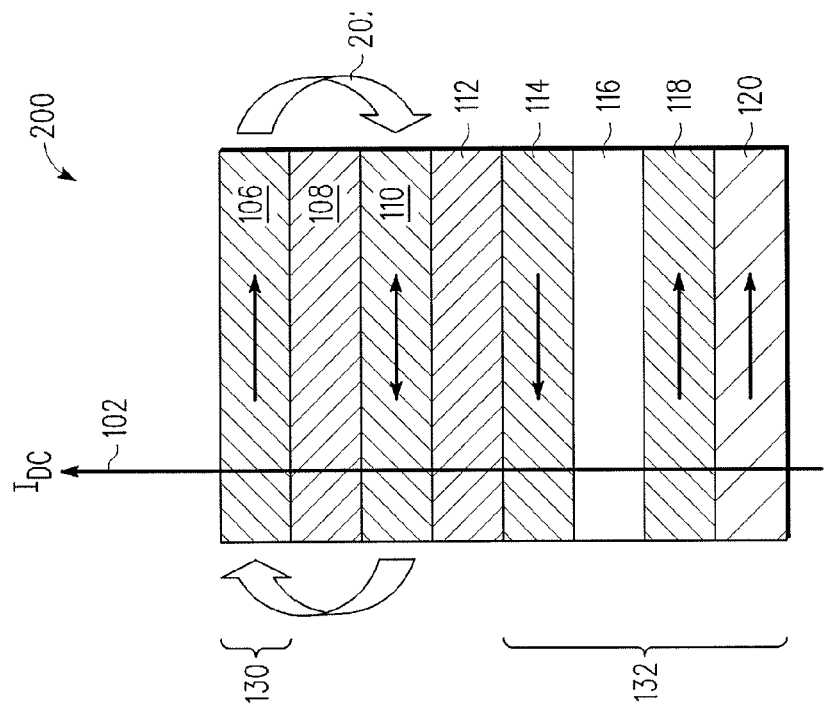
*FIG. 2* –PRIOR ART–
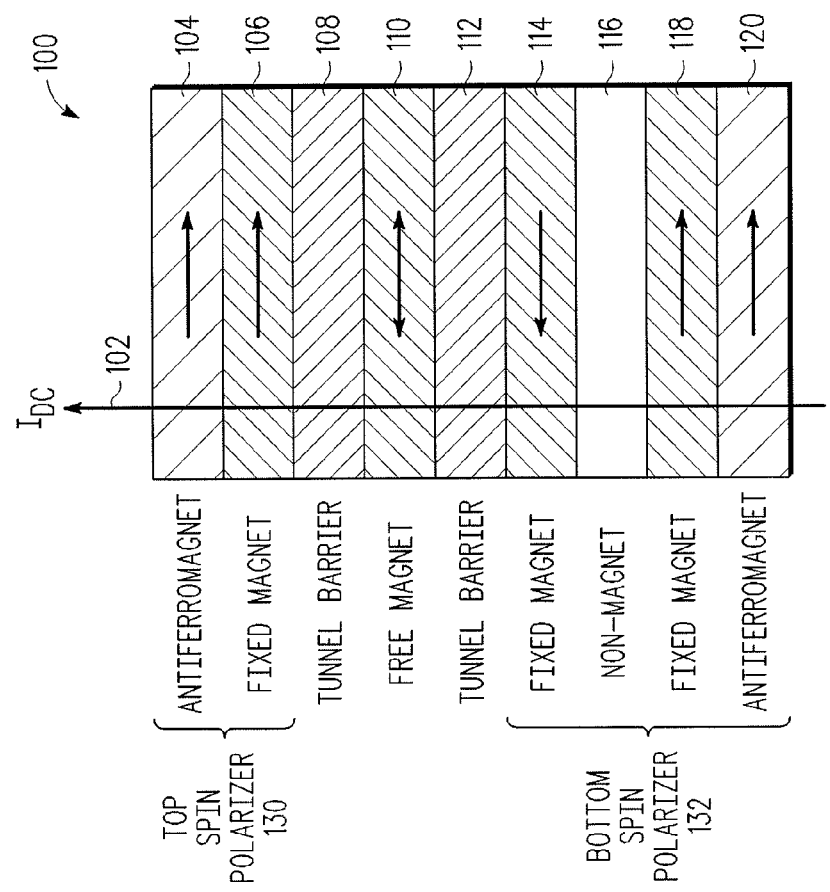
*FIG. 1* –PRIOR ART–

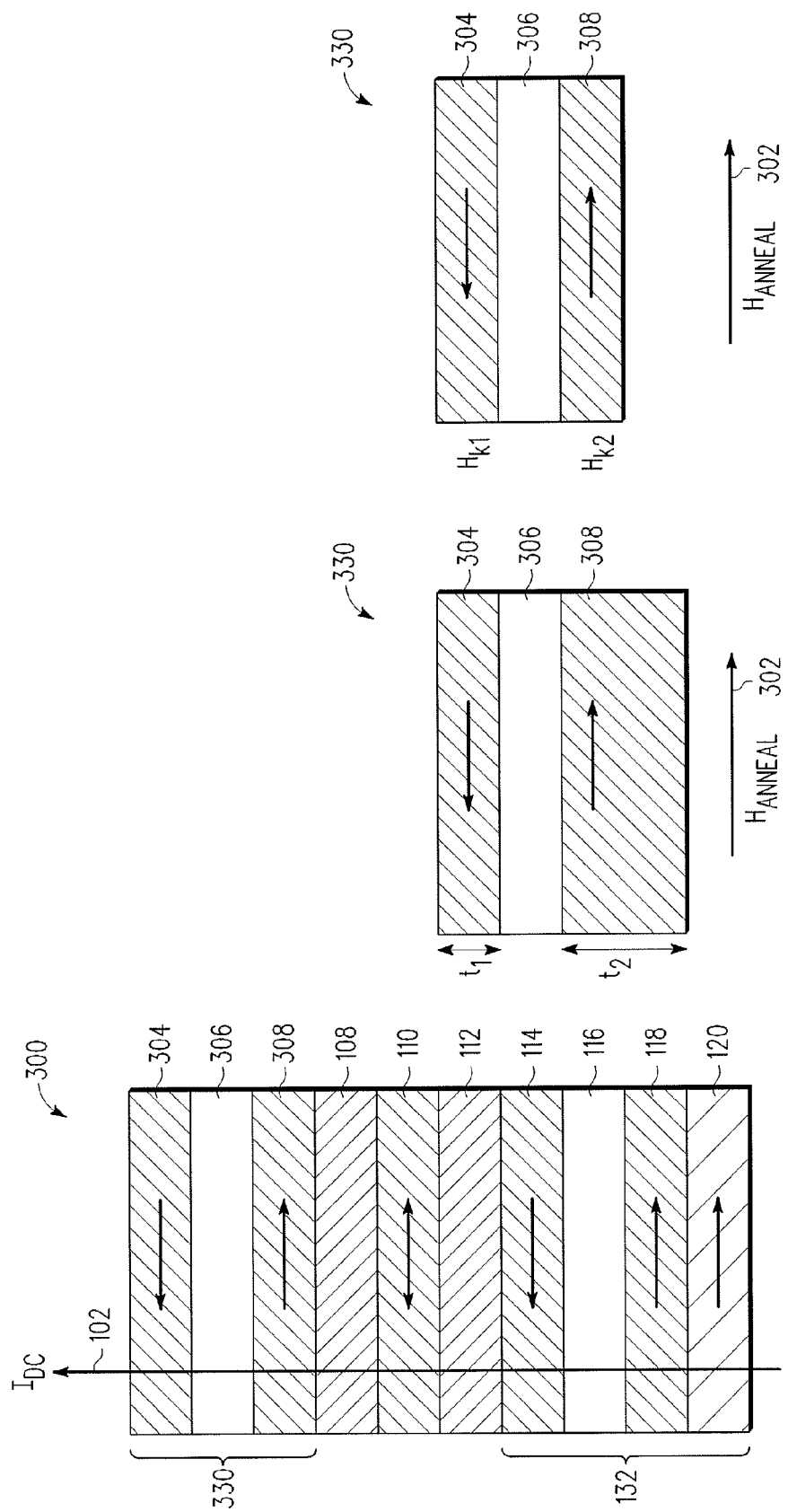

SPIN-TRANSFER MRAM STRUCTURE AND METHODS

TECHNICAL FIELD

The present invention generally relates to magnetoresistive random access memories (MRAM), and more particularly relates to spin-transfer MRAMs.

BACKGROUND

Magnetoresistive random access memories (MRAMs) combine magnetic components with standard silicon-based microelectronics to achieve non-volatility, high-speed operation, and excellent read/write endurance. In an MRAM, information is stored in the magnetization directions of the free magnetic layers of the individual bits in the memory array. In a standard MRAM, the bit state is programmed to a "1" or "0" using applied magnetic fields generated by currents flowing along adjacent conductors—e.g., orthogonally-situated word lines and bit lines. The applied magnetic fields selectively switch the magnetic moment direction as needed to program the bit state.

In spin-transfer MRAM devices, however, the bits are written by forcing a current directly through the stack of materials that make up the bit. Generally speaking, the write current, which is spin polarized by passing through one layer, exerts a spin torque on the subsequent layer. This torque can be used to switch the magnetization of the free layer between two stable states by changing the write current polarity. Spin-transfer MRAMs are advantageous in that they may provide for greater density with lower power consumption.

In order to reduce write current, some spin-transfer MRAMs incorporate a dual spin-filter, in which the bit stack includes two different spin-polarizing layers—one on each side of the free layer—to improve spin-transfer efficiency by increasing the effective spin-transfer torque on the free layer. Referring to FIG. 1, for example, a typical spin-transfer MRAM 100 with a dual spin-filter generally includes a free magnet layer 110 separated from a top spin polarizer 130 and a bottom spin polarizer 132 by nonmagnetic spacers 108 and 112. The top spin polarizer includes a fixed magnet layer 106 and an antiferromagnet layer 104 which acts to "pin" fixed magnet layer 106 to a particular alignment via exchange coupling. The bottom spin polarizer includes two fixed magnets 114 and 118 separated by a non-magnet layer 116 and an antiferromagnet 120 used to pin fixed magnet 118 to a particular alignment. An antiferromagnetic coupling across nonmagnet 116 aligns fixed magnets 114 and 118 antiparallel to each other. In this illustration, bold arrows are used to indicate the direction of the magnetic moment for individual layers. The magnetization directions of the top and bottom spin polarizers 130 and 132 are set using a high-temperature anneal in an applied magnetic field pointing to the right in FIG. 1. Each of the nonmagnetic spacers 108 and 112 can be either an electrically insulating tunnel barrier or an electrically conductive metallic layer. In reading the state of the free magnet 110, the output signal is generated from the combined magnetoresistance signals across both of the nonmagnetic spacers 108 and 112. The magnetoresistance signal is due to tunneling magnetoresistance if the spacer is an electrical insulator, or to giant magnetoresistance if the spacer is a nonmagnetic metal.

When a write current 102 ($I_{DC}$) flows through structure 100 from bottom to top (wherein arrow 102 is intended to show the direction of electron flow), electrons passing through fixed magnet 114 are spin-polarized to the left (in this illustration) and therefore place a torque on the free magnet 110 to switch its moment to the left. As electrons cross free magnet 110 and are incident on magnet 106 of top spin polarizer 130, some electrons will reflect back to free magnet 110 with a spin-polarization to the left, thus also placing a torque to switch free magnet 110 to the left. Thus, the torques from the top and bottom spin polarizers combine in an efficient manner. Free magnet 110 can similarly be switched to the right by forcing electron flow in the opposite direction. In the interest of high spin-transfer efficiency and low write current, the magnets neighboring free magnet 110 (i.e., fixed magnet 106 and 114) are preferably aligned antiparallel to each other.

Known dual spin-filter spin-transfer MRAMs are unsatisfactory in a number of respects. For example, top antiferromagnet 104 typically consists of a relatively thick layer (e.g., 100-200 Angstroms) of PtMn or IrMn. During fabrication, the thin film bit stack 100 must be etched to define the individual memory bits in the MRAM array. The presence of the relatively thick antiferromagnet layer 104 significantly increases etch complexity.

To address this problem, other prior art MRAMs are fabricated without a top antiferromagnet layer, as shown in FIG. 2. In this design, fixed magnet 106 is set by applying a strong magnetic field (pointing to the right in FIG. 2) during annealing, which also sets bottom spin polarizer 132 as shown. However, while this design improves manufacturability by removing the topmost antiferromagnet layer, the resulting structure is still undesirable in that a large offset magnetic field 202 affects free layer 110 due to the presence of top fixed magnet 106. The offset field can disrupt the symmetry between the magnitude of the write currents needed for switching the free layer 110 in either of its two directions, and can decrease the reproducibility of spin-transfer switching between different bits in the memory. In comparison, the fields from the bottom fixed magnets 114 and 118 nearly cancel each other, assuming the moments of magnets 114 and 118 are closely balanced.

It is therefore desirable to provide dual spin-filter spin-transfer MRAMs with improved manufacturability while maintaining a low offset magnetic field at the free magnet layer. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and FIG. 1 is a cross-sectional view of a conventional prior art spin-transfer MRAM;

FIG. 2 is a cross-sectional view of another conventional prior art spin-transfer MRAM;

FIG. 3 is a cross-sectional view of a spin-transfer MRAM in accordance with an exemplary embodiment; and FIG. 4 is a cross-sectional view of a spin polarizer in accordance with one embodiment;

FIG. 5 is a cross-sectional view of a spin polarizer in accordance with another embodiment;

DETAILED DESCRIPTION

Figure 7:
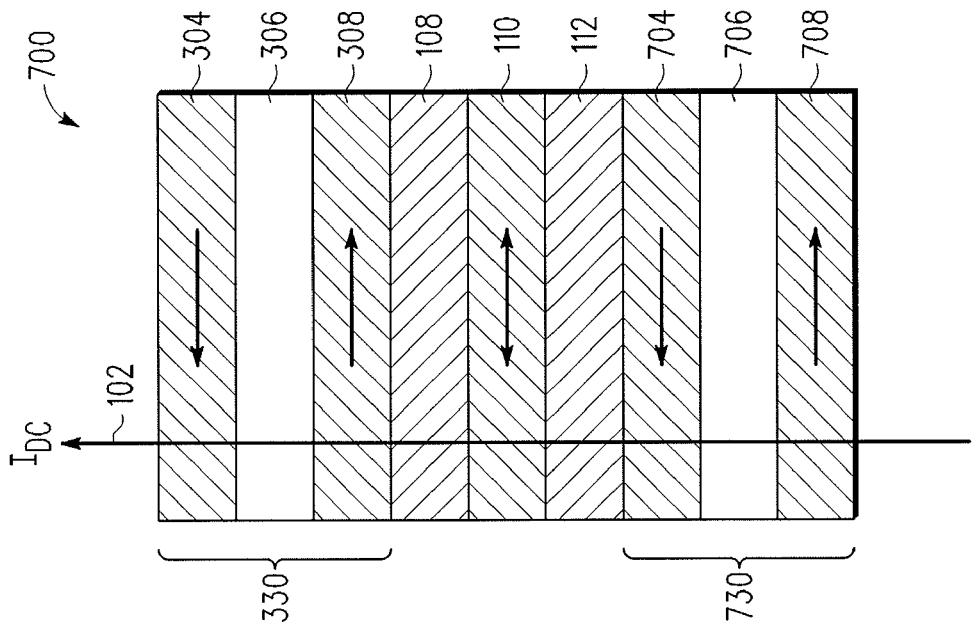
FIG. 7 is a cross-sectional view of an MRAM device in accordance with an alternate embodiment.

The following detailed description is merely exemplary in nature and is not intended to limit the range of possible embodiments and applications. Furthermore, there is no intention to be bound by any theory presented in the preceding background or the following detailed description.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein. Unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard MRAM processing techniques, fundamental principles of magnetism, and basic operational principles of memory devices.

In general, what is described herein is a dual spin-filter structure for spin-transfer MRAM devices that incorporates an unpinned synthetic antiferromagnet as the top and/or bottom spin polarizer. This results in a simplified etch process (by removing the relatively thick anti-ferromagnet layer) while substantially eliminating the problem of offset magnetic field on the free layer (by using a pair of strong, antiparallel fixed magnets).

Referring to FIG. 3, an exemplary dual spin-filter spin-transfer MRAM bit structure (or "stack") 300 generally includes a free magnet layer (or "free layer") 110 separated from a top spin polarizer 330 and a bottom spin polarizer 132 via tunnel barriers 108 and 112. Either or both of the layers 108 and 112 may also be nonmagnetic metals. In this illustration, bold arrows placed within the layers are used to illustrate relative magnetic alignments, or "vectors." For the purposes of clarity, some commonly-used layers have not been illustrated in the drawings, including various protective cap layers, seed layers, and the underlying substrate (which may be a conventional semiconductor substrate or any other suitable structure).

Top spin polarizer 330 includes a non-magnetic layer ("spacer layer," or "coupling layer") 306 between two fixed, antiparallel magnet layers (or "ferromagnets") 304 and 308, the properties of which will be described in further detail below. The magnetic moments of fixed magnet layers 304 and 308 are set such that they are antiparallel due to antiferromagnetic coupling across nonmagnet 306. Thus, in contrast to structure 100 shown in FIG. 1, structure 300 does not include an antiferromagnet layer 104 adjacent to, and sharing magnetic alignment with, a fixed magnet layer 106.

Top spin polarizer 330 is a synthetic antiferromagnet (SAF) in that it comprises two ferromagnetic layers separated by a non-magnetic antiferromagnetic coupling spacer layer. It is an "unpinned" SAF in that neither magnet 304 nor 308 has an alignment that is fixed by an associated antiferromagnet. In contrast to structure 200 shown in FIG. 2, the offset field 202 experienced by free magnet 110 is substantially eliminated because fixed magnets 304 and 308 are antiparallel to each other and have approximately equal magnetic moments.

It is desirable for spin polarizers 330 and 132 to be relatively unaffected by spin-transfer torque from free layer 110, so that only the direction of the free layer 110 changes when a write current is applied. Bottom spin-polarizer 132 is relatively unaffected by spin-transfer torque due to the strong exchange pinning to the bottom antiferromagnet 120. The top unpinned SAF in top spin-polarizer 330 is also relatively unaffected by spin-transfer torque when its total magnetic moment is significantly greater than that of free magnet 110. The magnetic moment of top spin polarizer 330 may be larger due to a larger total volume and/or larger magnetization density for fixed magnets 304 and 308 combined compared to free magnet 110.

Fixed magnet layers 304 and 308 (as well as 114 and 118) may comprise any suitable material having the desired ferromagnetic properties. Popular materials include Co and Fe, but other elements and combinations may be used. In one embodiment, for example, both fixed magnets 304 and 308 comprise about 40-50 Å of CoFe, and free magnet 110 comprises about 25-35 Å of CoFeB. Half-metallic ferromagnets, such as, for example, $CrO_2$, $Fe_3O_4$, or NiMnSb may also be used in order to give a very large spin-polarization, which will give a large magnetoresistance signal for read output as well as a high spin-transfer efficiency.

Nonmagnet layer 306 may comprise any suitable material or combination of materials that produce the desired antiparallel coupling. Suitable materials include, for example, Ru, Rh, Cr, V, Mo, Os and alloys thereof. In one embodiment, nonmagnetic layer 306 comprises Ru having a thickness of approximately 8 Å. Nonmagnetic layer 306 may also comprise a material, such as Ti or Ta, that does not produce any antiparallel coupling between continuous magnetic films, but merely causes exchange decoupling between layers 304 and 308. In this embodiment, layers 304 and 308 will still be antiferromagnetically coupled due to magnetostatic fields generated at the end of each layer.

During fabrication of MRAM structure 300, each succeeding layer (i.e., layers 120, 118, 116, 114, 112, 110, 108, 308, 306, 304) is deposited or otherwise formed in sequence and each MRAM bit may be defined by selective deposition, photolithography processing, and etching in accordance with any of the various conventional techniques known in the semiconductor industry. During deposition of the various fixed and free magnet layers, a magnetic field may be provided to set a preferred easy magnetic axis of the layer (i.e., via induced anisotropy). Similarly, a strong magnetic field applied during the post-deposition high-temperature anneal step may be used to induce a preferred easy axis and a preferred pinning direction for any antiferromagnetically pinned materials.

As is clear from the above description, it is desirable for the magnetic vectors within fixed magnet layers 304 and 308 to point in particular directions. However, in the case of a balanced SAF, this is difficult to achieve because the symmetric nature of the structure ensures that it is equally likely for the structure to end up in either of the two stable states after a high-field anneal process step, such as is used to set the direction of the bottom antiferromagnet 120. Empirical resistance vs. field (R—H) loops for perfectly-balanced SAFs show that some curves have high resistance at positive fields and low resistance at negative fields, and others have low resistance at positive fields and high resistance at negative fields. Some SAFs are therefore set in one direction, while others are set in the opposite direction.

Methods in accordance with various embodiments address this issue by introducing symmetry breakers in the SAF. That is, a slightly magnetically-imbalanced structure makes the fixed SAFs fall into a preferred state when removed from the magnetic field used for the high-field anneal step. In this regard, while a small amount of imbalance is sufficient to force the desired alignment, too much imbalance in the SAF may result in a large net magnetic field acting on free magnet 110, influencing device characteristics, and changing the switching behavior of the free magnet.

Figure 6:
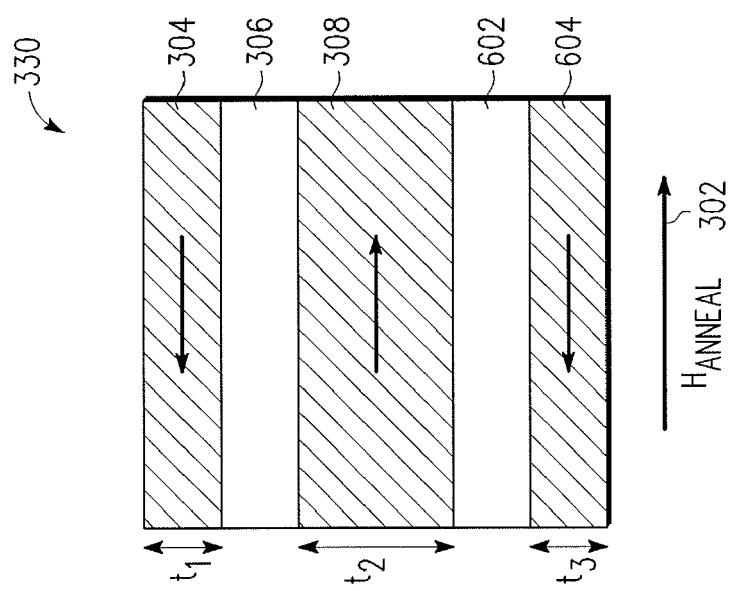
FIG. 6 is a cross-sectional view of a spin polarizer in accordance with yet another embodiment.

The desired magnetic imbalance may be accomplished in a variety of ways, as shown in FIGS. 4-6, in which only the top spin polarizer 330 is shown for clarity. In one embodiment, illustrated in FIG. 4, one layer is fabricated such that it is slightly thicker than the other, generating a small net magnetic moment for the trilayer structure 330. Thus layer 304 has a thickness $t_1$, and layer 308 has a thickness $t_2$, where $t_2 > t_1$. The thickness imbalance between $t_1$ and $t_2$ is approximately between 0.5% and 10%. The applied magnetic field during anneal is indicated as arrow 302 ($H_{anneal}$). After removal of $H_{anneal}$, layer 308 points to the right along $H_{anneal}$ since its thickness and magnetic moment is larger than for layer 304.

Another scheme for creating the desired magnetic imbalance is illustrated in FIG. 5, where the material properties for the two magnets 304 and 308 are selected to vary the intrinsic anisotropy field ($H_k$) of the materials. For example, different alloys of NiFe or CoFe can be used to give a factor of up to 2 to 4 or more difference in $H_k$. In the illustrated embodiment, layer 304 exhibits an anisotropy $H_{k1}$, and layer 308 exhibits an anisotropy $H_{k2}$, where $H_{k2} > H_{k1}$. The difference in $H_k$ gives an anisotropy energy difference for the two layers. Therefore, even after saturation from a large external field, the layer with the higher $H_k$ will stay closer to the applied field direction so as to minimize energy. The layer with the lower $H_k$ (layer 304) will then reverse with respect to the other layer during fabrication.

Yet another symmetry-breaking structure is shown in FIG. 6. This structure consists of a middle fixed magnet layer 308 having a thickness $t_2$, and upper and lower magnetic layers 304 and 604 having thicknesses $t_1$ and $t_3$ respectively. Non-magnetic spacer layers 306 and 602 are positioned between the various layers, as shown, and provide antiparallel coupling between fixed magnets 304 and 308 as well as 308 and 604. In the illustrated embodiment, $t_2 \approx 2t_1 \approx 2t_3$, although other thicknesses may be used in other embodiments. In this way, the resulting magnetic moment of the structure is approximately balanced so as not to exert a large offset field on the free layer. The magnetic Zeeman energy for the middle fixed magnet layer 308 is twice that of either outer magnetic layer 304 and 604. In addition, the magnetic shape anisotropy for the middle magnet layer 308 is greater than that of the outer ferromagnetic layers 304 and 604. The net result is that, after saturation in an applied magnetic field and removal of the that field, the thicker middle ferromagnetic layer 308 remains pointing in the direction of the applied magnetic field, while the thinner ferromagnetic outer layers 304 and 604 reverse. Thus, to align the top and bottom spin polarizers for maximum spin-transfer efficiency of the dual spin-filter using the symmetry breaking scheme in FIG. 6, the bottom antiferromagnets 120 and bottom fixed layers 118 and 114 are first set as shown in FIG. 3 using a high-temperature anneal with field $H_{anneal}$ 302 pointing to the right. Then, after cooling below the transition temperature of bottom antiferromagnet 120, a second applied field would be used pointing to the left, so that magnet 308 points to the left and magnets 304 and 604 point to the right. Magnets 604 and 114 on either side of the free layer 110 are then antiparallel to each other, as desired for high spin-transfer efficiency.

In an alternate embodiment, the unpinned SAF structure used for top spin polarizer 330 may also be used for the bottom spin polarizer. That is, referring to FIG. 7, bottom spin polarizer 730 may have the same or similar structure as top spin polarizer 330. In the illustrated embodiment, bottom spin polarizer 730 includes fixed magnets 704 and 708 separated by a non-magnetic layer 706 which provides antiparallel coupling between fixed magnets 704 and 708. The various symmetry-breaking methods and structures described above in conjunction with FIGS. 4-6 may also be applied to bottom spin polarizer 730.

The configuration in FIG. 7 offers the advantage of simplifying the dual spin-filter stack by removing the antiferromagnetic layer from the bottom spin polarizer 730, which could possibly lead to reduced film roughness and improved tunnel barrier quality, less diffusion of Mn out of the typically PtMn or IrMn antiferromagnetic layer, and fewer source material targets required in the sputter-deposition chamber for producing the thin film. Another embodiment comprises the thin film stack as shown in FIG. 7, but with an antiferromagnetic pinning layer included for the top spin polarizer 330 but not the bottom spin polarizer 730. As in FIG. 1, this structure would have the disadvantage of an increased complexity for patterning the MRAM bit due to etching through the top antiferromagnet, but it would offer the advantage of allowing the deposition of the tunnel barrier layers on a film stack without an underlying antiferromagnetic layer.

In summary, a spin-transfer MRAM bit comprises a free magnet layer positioned between a first spin polarizer and a second spin polarizer, wherein at least one of the first and second spin polarizers comprises an unpinned synthetic antiferromagnet (SAF). The first spin polarizer may comprise: a first fixed magnet layer; a second fixed magnet layer having a magnetic moment antiparallel to a magnetic moment of the first fixed magnet layer; and a coupling layer positioned between the first fixed magnet layer and the second fixed magnet layer. In one embodiment, the free magnet layer comprises CoFeB, and the first and second fixed magnet layers comprise CoFe. Another embodiment further comprises: a third fixed magnet layer; and a second coupling layer positioned between the second fixed magnet layer and the third fixed magnet layer, wherein a thickness of the first fixed magnet layer is substantially equal to a thickness of the third fixed magnet layer, and is less than a thickness of the second magnet layer.

In one embodiment, the unpinned SAF has a first fixed layer and a second fixed layer that together exhibit a magnetic moment difference of between approximately 0.5 and 10.0 percent. In another, the unpinned SAF has a first fixed magnet layer with a first intrinsic anisotropy, and a second fixed magnet layer with a second intrinsic anisotropy that is not equal to the first intrinsic anisotropy. In yet another, the unpinned SAF has a first fixed magnet layer with a first thickness, and a second fixed magnet layer with a second thickness that is not equal to the first thickness.

A method for forming a spin-transfer MRAM bit comprises: forming a first spin polarizer; forming a first nonmagnetic spacer layer over the first spin polarizer; forming a free magnet layer over the first nonmagnetic spacer layer; forming a second nonmagnetic spacer layer over the free magnet layer; and forming a second spin polarizer over the second nonmagnetic spacer layer; wherein the step of forming a first spin polarizer or the step of forming the second spin polarizer includes forming an unpinned synthetic antiferromagnet (SAF). Forming the SAF may include forming a first fixed magnet layer; forming a coupling layer over the first fixed magnet layer; and forming a second fixed magnet layer over the coupling layer such that the second fixed magnet layer has a magnetic moment that is antiparallel to a magnetic moment of the first fixed magnet layer. In one embodiment, forming the free magnet layer includes depositing a layer of CoFeB, and forming the first and second fixed magnet layers includes depositing layers of CoFe. In another, forming the SAF includes forming the SAF such that it has a total magnetic moment that is greater than a total magnetic moment of the free magnet layer. In a particular embodiment, forming the first and second fixed magnet layers includes forming the first magnet layer such that it has a magnetic moment that is different from a magnetic moment of the second magnet layer by approximately 0.5 and 10.0 percent. The method may further include annealing the SAF while applying a magnetic field. In one embodiment, the first fixed magnet layer is formed such that it has a first thickness, and the second fixed magnet layer is formed such that it has a second thickness that is not equal to the first thickness.

A further embodiment includes: forming a second coupling layer over the second fixed magnet layer; and forming a third fixed magnet layer over the second coupling layer such that a thickness of the first fixed magnet layer is substantially equal to a thickness of the third fixed magnet layer, and is less than a thickness of the second magnet layer.

An MRAM device in accordance with one embodiment comprises a plurality of spin-transfer MRAM bits, wherein each spin-transfer MRAM bit comprises a free magnet layer positioned between a first spin polarizer and a second spin polarizer, and wherein at least one of the first and second spin polarizers comprises an unpinned synthetic antiferromagnet (SAF). In one embodiment, for each bit, the first spin polarizer comprises a first fixed magnet layer, a second fixed magnet layer having a magnetic moment antiparallel to a magnetic moment of the first fixed magnet layer, and a coupling layer positioned between the first fixed magnet layer and the second fixed magnet layer. The free magnet layer may comprise CoFeB, and the first and second fixed magnet layers may comprise CoFe. The first spin polarizer may have a first total magnetic moment, and the free magnet layer may have a second total magnetic moment that is less than the first total magnetic moment. In one embodiment, the first fixed magnet layer has a magnetic moment that is different from a magnetic moment of the second fixed magnet layer.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the embodiments in any way. Rather, the foregoing detailed description will provide those skilled in the art with a convenient road map for implementing an exemplary embodiment, it being understood that various changes may be made in the function and arrangement of elements described in an exemplary embodiment without departing from the scope as set forth in the appended claims.

The invention claimed is:

1. A spin-transfer MRAM bit comprising a free magnet layer positioned between a first spin polarizer and a second spin polarizer, wherein at least one of the first and second spin polarizers comprises an unpinned synthetic antiferromagnet (SAF), wherein the unpinned SAF has a first fixed magnet layer with a first thickness, and a second fixed magnet layer with a second thickness that is not equal to the first thickness, and a coupling layer positioned between the first and second fixed magnet layers.

2. The spin-transfer MRAM bit of claim 1, wherein the free magnet layer comprises CoFeB, and the first and second fixed magnet layers comprise CoFe based alloys.

3. The MRAM bit of claim 1, further comprising:
a third fixed magnet layer; and
a second coupling layer positioned between the second fixed magnet layer and the third fixed magnet layer, wherein a thickness of the first fixed magnet layer is substantially equal to a thickness of the third fixed magnet layer, and is less than a thickness of the second magnet layer.

4. The spin-transfer MRAM bit of claim 1, wherein the unpinned SAF has a first fixed layer and a second fixed layer that together exhibit a magnetic moment difference of between approximately 0.5 and 10.0 percent.

5. The spin-transfer MRAM bit of claim 1, wherein the SAF has a total magnetic moment that is greater than a total magnetic moment of the free magnet layer.

6. A spin-transfer MRAM bit comprising a free magnet layer positioned between a first spin polarizer and a second spin polarizer, wherein at least one of the first and second spin polarizers comprises an unpinned synthetic antiferromagnet (SAF), wherein the unpinned SAF has a first fixed magnet layer with a first intrinsic anisotropy, and a second fixed magnet layer with a second intrinsic anisotropy that is not equal to the first intrinsic anisotropy, and a coupling layer positioned between the first and second fixed magnet layers.

7. The MRAM device of claim 6, wherein the free magnet layer comprises CoFeB, and the first and second fixed magnet layers comprise CoFe based alloys.

8. The spin-transfer MRAM bit of claim 6, wherein the SAF has a total magnetic moment that is greater than a total magnetic moment of the free magnet layer.

9. A method for forming a spin-transfer MRAM bit, comprising:
forming a first spin polarizer;
forming a first nonmagnetic spacer layer over the first spin polarizer;
forming a free magnet layer over the first nonmagnetic spacer layer;
forming a second nonmagnetic spacer layer over the free magnet layer; and
forming a second spin polarizer over the second nonmagnetic spacer layer;
wherein the step of forming a first spin polarizer or the step of forming the second spin polarizer includes forming an unpinned synthetic antiferromagnet (SAF), wherein the first fixed magnet layer is formed such that it has a first thickness, and the second fixed magnet layer is formed such that it has a second thickness that is not equal to the first thickness, and it has a coupling layer positioned between the first and second fixed magnet layers.

10. The method of claim 9, wherein forming the free magnet layer includes depositing a layer of CoFeB, and forming the first and second fixed magnet layers includes depositing layers of CoFe based alloys.

11. The method of claim 9, wherein forming the SAF includes forming the SAF such that it has a total magnetic moment that is greater than a total magnetic moment of the free magnet layer.

12. The method of claim 9, wherein forming the first and second fixed magnet layers includes forming the first magnet layer such that it has a magnetic moment that is different from a magnetic moment of the second magnet layer by approximately 0.5 and 10.0 percent.

13. The method of claim 9, further including:
forming a second coupling layer over the second fixed magnet layer;
forming a third fixed magnet layer over the second coupling layer such that a thickness of the first fixed magnet layer is substantially equal to a thickness of the third fixed magnet layer, and is less than a thickness of the second magnet layer.

14. A method for forming a spin-transfer MRAM bit, comprising:
forming a first spin polarizer;
forming a first nonmagnetic spacer layer over the first spin polarizer;
forming a free magnet layer over the first nonmagnetic spacer layer;
forming a second nonmagnetic spacer layer over the free magnet layer; and
forming a second spin polarizer over the second nonmagnetic spacer layer;
wherein the step of forming a first spin polarizer or the step of forming the second spin polarizer includes forming an unpinned synthetic antiferromagnet (SAF), and wherein the unpinned SAF has a first fixed magnet layer with a first intrinsic anisotropy, a second fixed magnet layer with a second intrinsic anisotropy that is not equal to the first intrinsic anisotropy, and a coupling layer positioned between the first and second fixed magnet layers.

15. The method of claim 14, wherein forming the free magnet layer includes depositing a layer of CoFeB, and forming the first and second fixed magnet layers includes depositing layers of CoFe based alloys.

16. The method of claim 14, wherein forming the SAF includes forming the SAF such that it has a total magnetic moment that is greater than a total magnetic moment of the free magnet layer.

* * * * *